(12) United States Patent
Katsumata et al.

(10) Patent No.: US 7,336,143 B2
(45) Date of Patent: Feb. 26, 2008

(54) VARIABLE DELAY LINE USING VARIABLE REACTANCE DEVICES TO PROVIDE REFLECTED DELAY SIGNALS

(75) Inventors: Itsuaki Katsumata, Saku (JP); Tokumi Kobayashi, Tomi (JP); Masahiko Yokoyama, Tomi (JP)

(73) Assignee: Soshin Electric Co., Ltd., Saku (JP)

( * ) Notice: Subject to any disclaimer, the term of this patent is extended or adjusted under 35 U.S.C. 154(b) by 263 days.

(21) Appl. No.: 10/529,671

(22) PCT Filed: Oct. 10, 2003

(86) PCT No.: PCT/JP03/13060

§ 371 (c)(1),
(2), (4) Date: Mar. 29, 2005

(87) PCT Pub. No.: WO2004/034578

PCT Pub. Date: Apr. 22, 2004

(65) Prior Publication Data

US 2006/0262475 A1    Nov. 23, 2006

(30) Foreign Application Priority Data

Oct. 10, 2002    (JP)    ............................ 2002-296956

(51) Int. Cl.
*H01P 1/18* (2006.01)
(52) U.S. Cl. ........................ 333/139; 333/164

(58) Field of Classification Search .............. 333/139, 333/156, 164
See application file for complete search history.

(56) References Cited

U.S. PATENT DOCUMENTS

| | | | | |
|---|---|---|---|---|
| 5,270,671 A | * | 12/1993 | Waterman | 333/161 |
| 6,020,795 A | * | 2/2000 | Kim | 333/33 |
| 6,333,683 B1 | * | 12/2001 | Hampel | 333/161 |
| 6,630,874 B2 | * | 10/2003 | Matsumoto et al. | 333/164 |
| 6,958,665 B2 | * | 10/2005 | Allison et al. | 333/164 |

FOREIGN PATENT DOCUMENTS

| | | |
|---|---|---|
| EP | 0 982 791 A2 | 3/2000 |
| JP | 54-124655 A1 | 9/1979 |
| JP | 05-206703 A1 | 8/1993 |
| JP | 08-008673 A1 | 1/1996 |
| JP | 11-068409 A1 | 3/1999 |
| JP | 2000-059105 A1 | 2/2000 |
| JP | 2001-119206 A1 | 4/2001 |
| JP | 2002-009573 A1 | 1/2002 |

OTHER PUBLICATIONS

U.S Appl. No. 11/817,419, filed Aug. 30, 2007, Morikaku et al.

* cited by examiner

*Primary Examiner*—Benny Lee
(74) *Attorney, Agent, or Firm*—Burr & Brown

(57) ABSTRACT

First and second reactance parts are connected with the first and second output terminals of a hybrid coupler. The first and second reactance parts have a substantially identical reactance X.

4 Claims, 18 Drawing Sheets

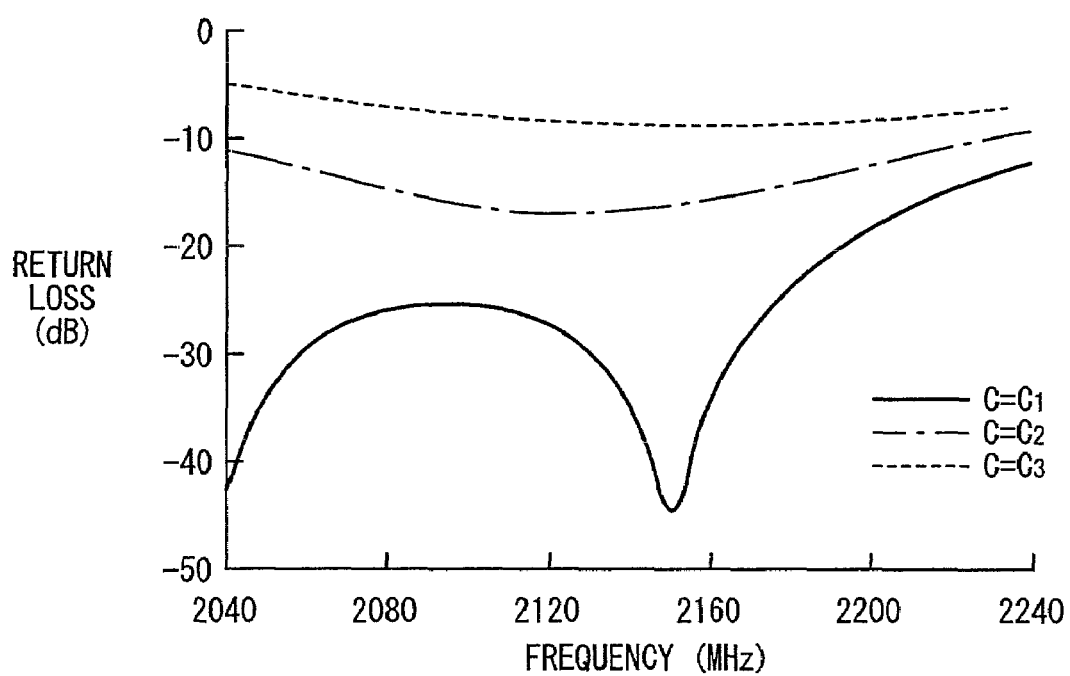

VARIABLE DELAY LINE USING VARIABLE REACTANCE DEVICES TO PROVIDE REFLECTED DELAY SIGNALS

TECHNICAL FIELD

The present invention relates to a variable delay line having a variable reactance device.

BACKGROUND ART

Variable delay lines that have been used in commercial radio communication devices in recent years are a bandpass filter that uses the transmission and receiving frequency band of the radio communication device as a signal passband. The variable delay lines are characterized in that the coupling capacitance of the bandpass filter is changed to change the passband thereof to change the absolute value of the delay time that the variable delay line has (hereinafter referred to as "absolute delay time").

As shown in FIG. 15, a conventional variable delay line 100 is arranged such that capacitors 106, 108 and a variable-capacitance capacitor 110 are connected in series between an input terminal 102 and an output terminal 104, and first and second resonant circuits 112, 114 are connected between one and other terminals of the variable-capacitance capacitor 110 and ground (see Japanese Laid-Open Patent Publication No. 2001-119206).

When a certain input signal is supplied from the input terminal 102 of the variable delay line 100, the output terminal 104 outputs an output signal having a predetermined absolute delay time shown in FIG. 16. If the coupling capacitance C of the variable-capacitance capacitor 110 shown in FIG. 17 is changed, then the absolute delay time changes as shown in FIG. 18. For example, if the coupling capacitance C is changed from C1 to C2 or C3 (C1>C2>C3), then the absolute delay time increases as shown by the different curves in FIG. 16. If the coupling capacitance C has a wider adjustable range, then the absolute delay time of the variable delay line 100 has a wider variable range (hereinafter referred to as "variable delay time").

If the coupling capacitance C is reduced, then the bandwidth of the passband of the variable delay line 100 becomes narrower, attenuating the frequency response of the variable delay line 100 shown in FIG. 17 and increasing the return loss shown in FIG. 18.

If the coupling capacitance C is changed, then the capacitor 106 and the first resonant circuit 112 near the input terminal 102 shown in FIG. 15 and the capacitor 108 and the second resonant circuit 114 near the output terminal 104 are brought out of balance thereby varying the values of the input and output impedances of the variable delay line 100. Thus, it is difficult to achieve impedance matching on the variable delay line 100. Therefore, the return loss shown in FIG. 18 increases. Furthermore, the frequency response shown in FIG. 17 are greatly attenuated, resulting in an increased insertion loss over the variable delay line 100 and an increased deviation of the absolute delay time shown in FIG. 16.

Under these circumstances, even when the variable delay line 100 shown in FIG. 15 is connected to other electronic components through the input terminal 102 and the output terminal 104, it is difficult to achieve impedance matching between the variable delay line 100 and the other electronic components. Consequently, the insertion loss over the variable delay line 100 and the radio communication device further increases. Since the above deviation is large, the passband of the variable delay line 100 is reduced, resulting in a significant distortion in the output signal output from the output terminal 104.

For example, if the variable delay line 100 is adapted in an actual radio communication device, then the variable delay line 100 requires a variable delay time of at least about 0.5 ns. However, inasmuch as the frequency response are reduced and the return loss is increased with a variable delay time of about 0.4 ns, as shown in FIGS. 16 through 18, it is difficult for the variable delay line 100 to have desired characteristics.

SUMMARY OF THE INVENTION

It is an object of the present invention to provide a variable delay line having a hybrid coupler and variable-reactance devices which are connected respectively to two output terminals of the hybrid coupler for suppressing variations in an input impedance and an output impedance of the variable delay line, reducing a deviation of the absolute delay time, increasing the variable delay time of the variable delay line, and widening the passband of the variable delay line.

A variable delay line according to the present invention includes a hybrid coupler having an input terminal for being supplied with an input signal, first and second output terminals for outputting first and second output signals, respectively, which are 90° out of phase with each other, and an isolation terminal for outputting a reflected signal based on the first and second output signals as a third output signal, and first and second reactance parts connected respectively to the first and second output terminals and having substantially same reactances, wherein the first and second reactance parts have first and second variable-reactance devices, respectively, having substantially same reactances.

The first and second reactance parts having substantially the same reactances have ends connected to the first and second output terminals, and other ends connected to ground.

When the input signal is supplied to the input terminal, the first output terminal outputs the first output signal which is in phase with the input signal, and the second output terminal outputs the second output signal which is 90° out of phase with the input signal. Therefore, the first and second output signals are 90° out of phase with each other.

Since the first and second reactance parts are connected to the first and second output terminals, first and second reflected signals are generated respectively at the first and second output terminals by the first and second output signals. A reflected signal which is a combination of the first and second reflected signals is output to the isolation terminal, and is 180° out of phase with the input signal. Since the interval between the isolation terminal and the input terminal functions as an isolator, the reflected wave of the reflected signal is attenuated while being transmitted from the isolation terminal to the input terminal, but is not output to the input terminal.

Therefore, the hybrid coupler and the first and second variable-reactance parts are capable of suppressing variations in the input impedance and the output impedance of the variable delay line. Accordingly, the deviation of the absolute delay time is reduced, and the variable delay line causes a low insertion loss, has a wide passband, and produces a third output signal of low distortion. Consequently, it is possible to increase the reliability of a radio communication device adapting the variable delay line.

When the reactances of first and second variable-reactance devices of the first and second variable-reactance parts are changed by the same value, the reactances of the first and second reactance parts are changed by the same value. Therefore, the reflected signal is changed by a desired value, and the absolute delay time of the variable delay line is changed by a certain value. When the reactances of the first and second variable-reactance devices are changed by a certain value, the variable delay line can have a desired absolute delay time and a desired variable delay time.

Preferably, the first and second reactance parts comprise respective series-connected circuits of first and second capacitors having substantially the same capacitances, first and second variable-capacitance devices as the first and second variable-reactance devices, and a first resonant circuit and a second resonant circuit.

When the capacitances of the first and second variable-capacitance devices are changed, the admittances of the first and second variable-capacitance devices change, resulting in a change in the reactances and admittances of the first and second reactance parts. Therefore, the absolute delay time and the variable delay time can be adjusted to desired values.

Since the first and second resonant circuits have respective resonant frequencies, the central frequency of the passband of the variable delay line is determined by the resonant frequencies. Therefore, it is possible with the above arrangement of the series-connected circuits to allow the variable delay line to have a desired passband, a desired absolute delay time, and a desired variable delay time.

With the above circuit arrangement of the variable delay line, the phase of the variable delay line changes when the absolute delay time is changed. With the above circuit arrangement, even when the resonant frequencies of the first and second resonant circuits are changed, the absolute delay time remains substantially unchanged, but only the phase of the variable delay line changes if the bandwidth of the variable delay line is wide.

In order to prevent the phase of the variable delay line from changing, series-connected circuits of third and fourth capacitors and third and fourth variable-capacitance devices as variable-reactance devices are preferably connected in parallel to the first resonant circuit and the second resonant circuit. With this arrangement, even when the absolute delay time of the variable delay line and the resonant frequencies of the first and second resonant circuits are changed, a change in the phase of the third output signal which is caused by the change in the absolute delay time and the resonant frequencies can be compensated for by adjusting the capacitances of the third and fourth variable-capacitance devices. Therefore, the absolute delay time and the resonant frequencies can be changed without changing the phase.

The first and second resonant circuits should preferably be LC resonant circuits, resonant circuits comprising distributed constant circuits, or dielectric resonators. The first through fourth variable-capacitance devices should preferably be circuit devices with variable capacitances. Such circuit devices include a varactor diode, a trimmer capacitor, etc.

In the above variable delay line, a plurality of ceramic layers may be stacked into an integral structural ceramic body, and the integral structural body may have a ceramic layer with the hybrid coupler disposed thereon, a ceramic layer with the first resonant circuit and the second resonant circuit disposed thereon, and a ceramic layer with at least the first and second capacitors disposed thereon. Since most of circuit devices of the variable delay line are disposed in the integral structural ceramic body, the variable delay line may be reduced in size.

BRIEF DESCRIPTION OF THE DRAWINGS

FIG. 18 is a diagram showing simulated values of the return loss of the variable delay line shown in FIG. 15.

BEST MODE FOR CARRYING OUT THE INVENTION

Figure 1:
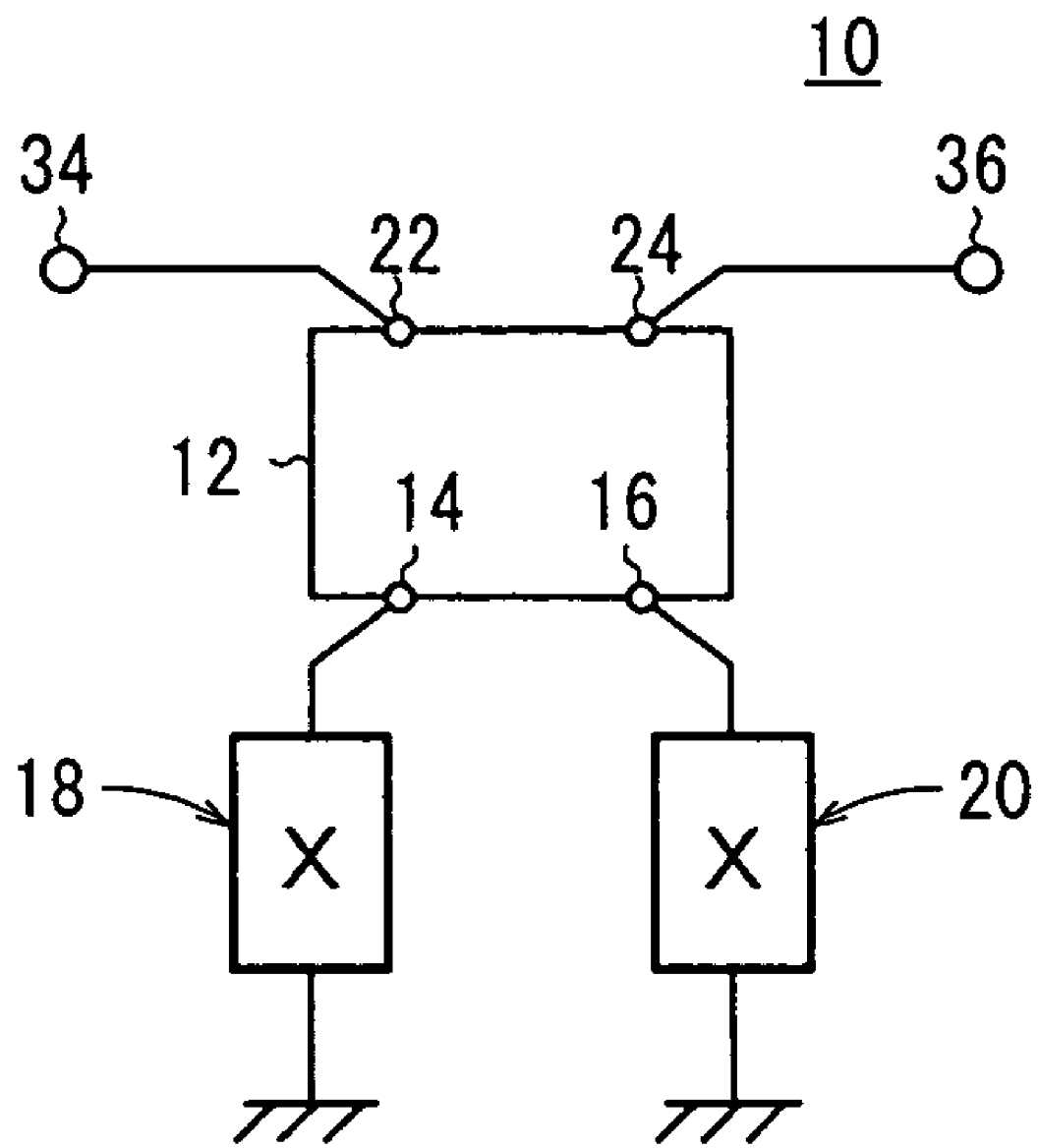
FIG. 1 is a circuit diagram of a variable delay line according to an embodiment of the present invention.

The invention will now be described in detail based on several embodiments, with reference to the attached drawings. In the drawings, the same or the similar numerical references refer to the same or similar elements.

As shown in FIG. 1, a variable delay line 10 according to an embodiment of the present invention has a hybrid coupler 12 and first and second reactance parts 18, 20 which are connected respectively to first and second output terminals 14, 16 of the hybrid coupler 12.

The hybrid coupler 12 has, in addition to the first and second output terminals 14, 16, an input terminal 22 for being supplied with an input signal, and an isolation terminal 24 for outputting a reflected signal based on first and second output signals output from the first and second output terminals 14, 16, as an output signal (third output signal) of the variable delay line 10. The first output terminal 14 is a 0° output terminal for outputting the first output signal that is in phase with the input signal supplied to the input terminal 22. The second output terminal 16 is a 90° output terminal for outputting the second output signal that is 90° out of phase with the input signal.

Figure 2:
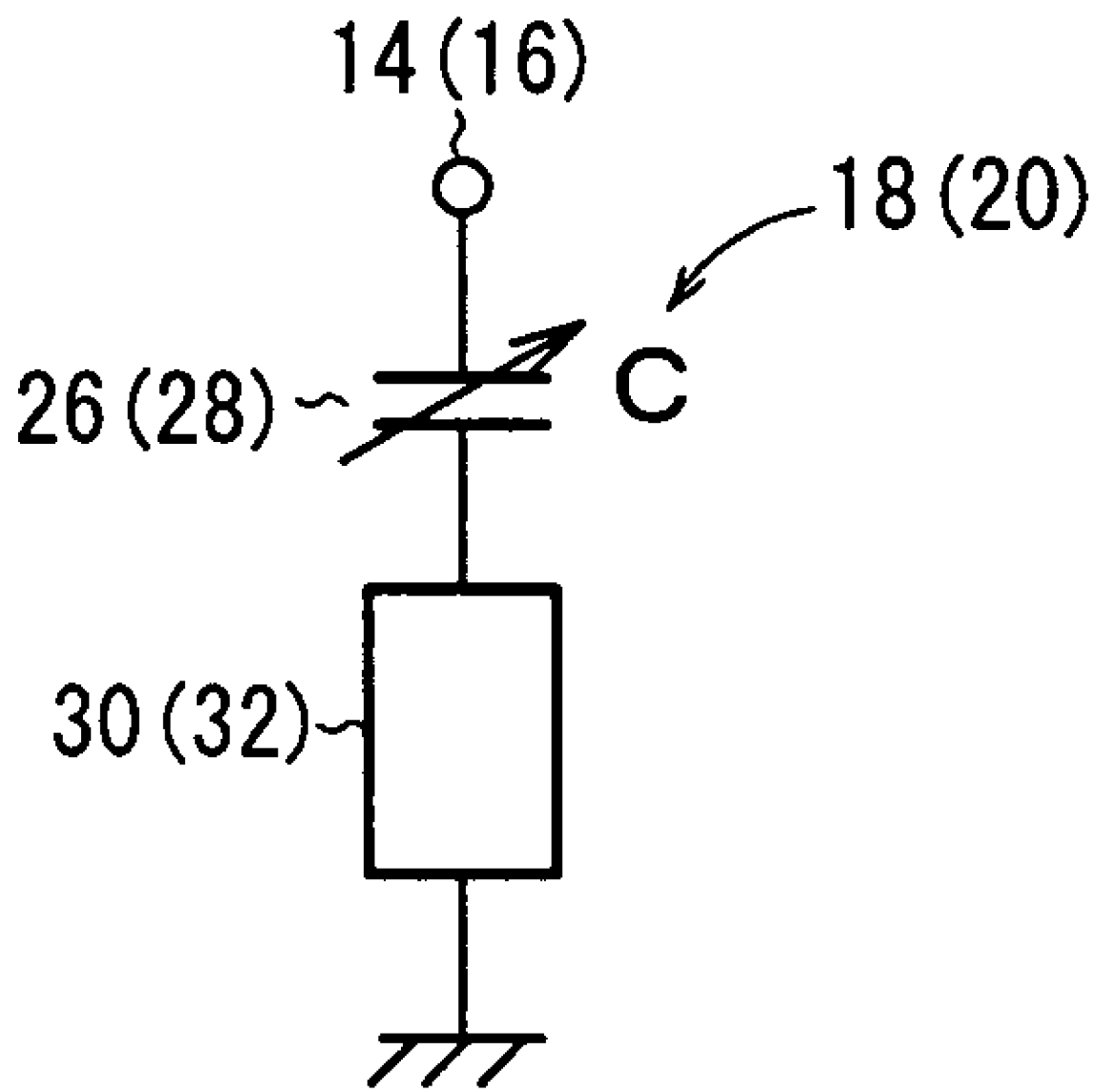
FIG. 2 is a circuit diagram of each of first and second reactance parts of the variable delay line shown in FIG. 1.

The first and second reactance parts 18, 20 have substantially the same reactance X, and have respective terminals connected to the first and second output terminals 14, 16 and other terminals connected to ground. As shown in FIG. 2, the first and second reactance parts 18, 20 comprise respective series-connected circuits of first and second variable-capacitance devices 26, 28 as variable-reactance devices and first and second resonant circuits 30, 32. The first and second variable-capacitance devices 26, 28 may be any device whose reactance X can be changed by changing their coupling capacitance C. Such circuit devices include a varactor diode, a trimmer capacitor, etc. The first and second resonant circuits 30, 32 should preferably be LC resonant circuits, resonant circuits comprising distributed constant circuits, or dielectric resonators.

Operation of the variable delay line 10 according to the present embodiment will be described below.

When an input signal is supplied to an input terminal 34 of the variable delay line 10 shown in FIG. 1, the input signal is supplied through the input terminal 22 to the hybrid coupler 12. At this time, first and second output signals are output to the respective first and second output terminals 14, 16. The first and second output signals are 90° out of phase with each other.

Since the first and second output terminals 14, 16 are grounded respectively through the first and second reactance parts 18, 20, the first and second output terminals 14, 16 generate first and second reflected signals, respectively. A reflected signal which is a combination of the first and second reflected signals is output to the isolation terminal 24, and output as an output signal of the variable delay line 10, i.e., a third output signal, to an output terminal 36. The reflected signal is 180° out of phase with the input signal.

Since the interval between the isolation terminal 24 and the input terminal 22 functions as an isolator, the reflected wave of the reflected signal is attenuated while being transmitted from the isolation terminal 24 to the input terminal 22, but is not output to the input terminal 22. That is, the reflected wave does not affect the input impedance and the output impedance of the variable delay line 10. Therefore, the hybrid coupler 12 and the first and second reactance parts 18, 20 are capable of suppressing variations in the input impedance and the output impedance of the variable delay line 10, allowing impedance matching to be easily achieved on the variable delay line 10.

With reference to FIG. 2, when the coupling capacitances C of the first and second variable-capacitance devices 26, 28 of the first and second reactance parts 18, 20 are changed by the same value, the reactances X of the first and second reactance parts 18, 20 are changed by the same value. Therefore, the third output signal can be changed by a desired value. Accordingly, the absolute delay time of the third output signal from the variable delay line 10 in FIG. 1 can be changed by a certain value, and the variable delay time can be set to a desired value. When the coupling capacitances C of the first and second variable-capacitance devices 26, 28 are changed by a certain value, the variable delay line 10 can have a desired absolute delay time and a desired variable delay time.

The first and second resonant circuits 30, 32 (see FIG. 2) have respective resonant frequencies. The central frequency of the passband of the variable delay line 10 is determined by these resonant frequencies. Therefore, the variable delay line 10 can have a desired passband by setting the resonant frequencies to a desired value.

The structure and operation of the variable delay line 10 according to the present embodiment have been described above. Variable delay lines 10A through 10C according to first through third specific examples, which serve as examples of the variable delay line 10, will be described below with reference to FIGS. 3 through 14.

Figure 3:
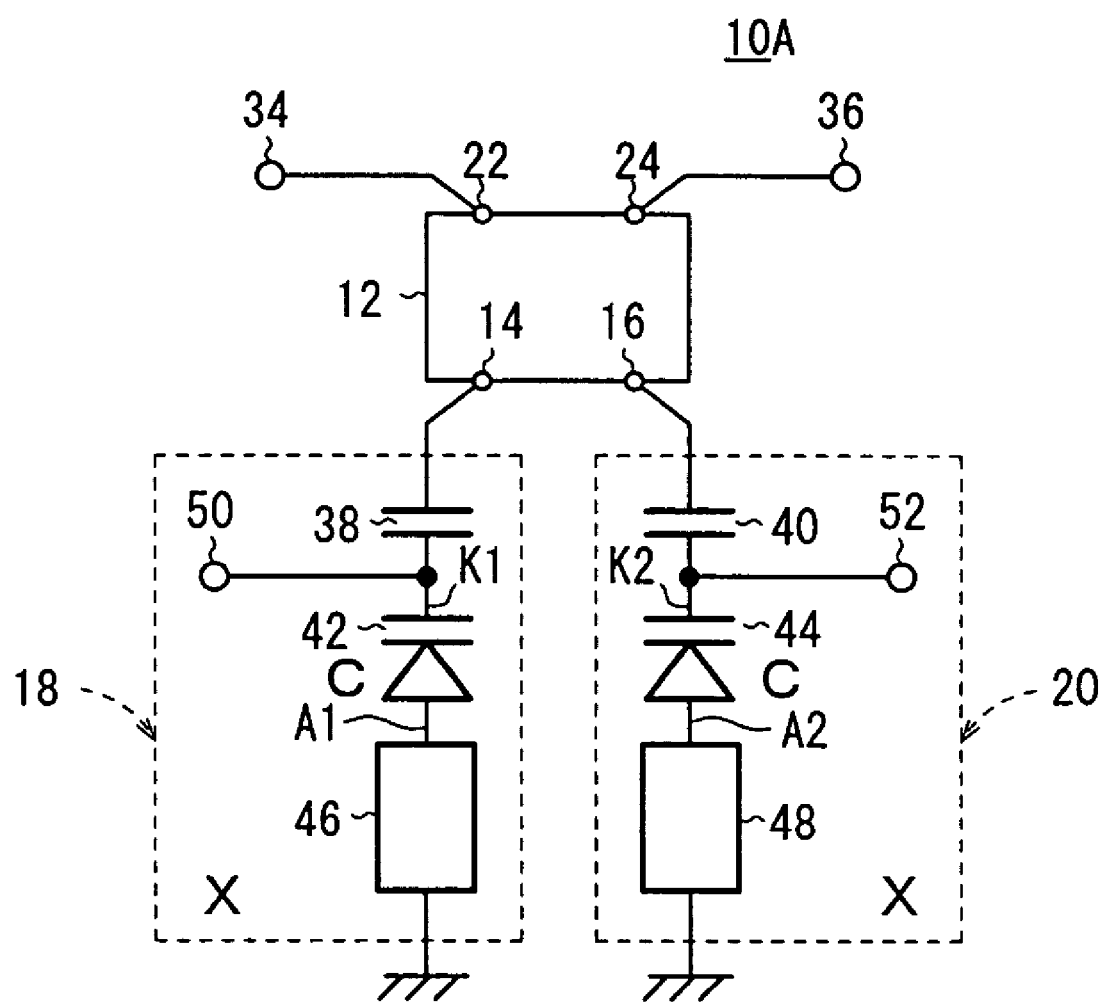
FIG. 3 is a circuit diagram of a variable delay line according to a first specific example.

The variable delay line 10A according to the first specific example shown in FIG. 3 is of substantially the same structure as the variable delay line 10 according to the present embodiment shown in FIGS. 1 and 2, but differs therefrom as follows.

As shown in FIG. 3, the first and second reactance parts 18, 20 comprise respective series-connected circuits of first and second capacitors 38, 40, first and second varactor diodes 42, 44, which are in replacement of the first and second variable-capacitance devices 26, 28, and first and second λ/4 dielectric resonators 46, 48, which are in replacement of the first and second resonant circuits 30, 32.

The first and second capacitors 38, 40 have respective terminals connected to the first and second output terminals 14, 16, respectively, and other terminals connected respectively to cathode terminals K1, K2 of the first and second varactor diodes 42, 44. The first and second varactor diodes 42, 44 have respective anode terminals A1, A2 connected respectively to the first and second λ/4 dielectric resonators 46, 48. First and second voltage control terminals 50, 52 are connected respectively to the cathode terminals K1, K2 for supplying DC voltages thereto.

With the variable delay line 10A according to the first specific example, when DC voltages having substantially the same value are supplied from the first and second voltage control terminals 50, 52 to the first and second varactor diodes 42, 44 through resistors or coils (not shown), the coupling capacitances C of the first and second varactor diodes 42, 44 are changed by the same value commensurate with the value of the DC voltages. Specifically, when the DC voltages increase, the coupling capacitances C of the first and second varactor diodes 42, 44 are reduced.

Figure 4:
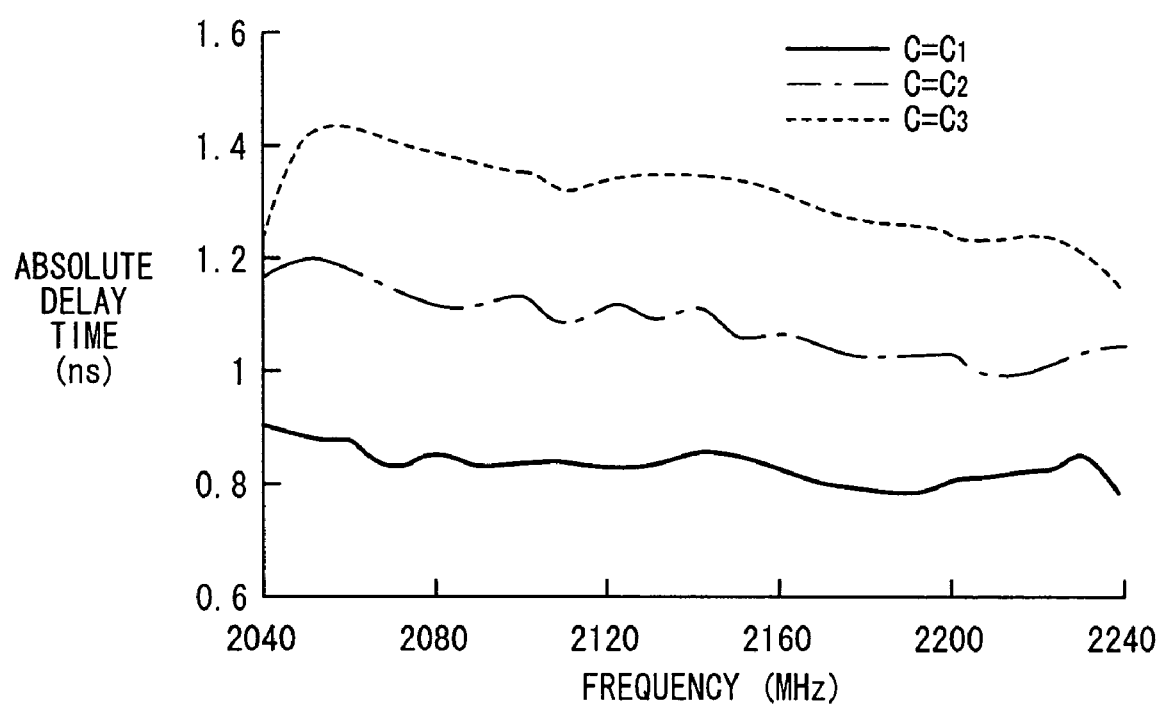
FIG. 4 is a diagram showing simulated values of the absolute delay time of the variable delay line shown in FIG. 3.

When the coupling capacitances C change from C=C1 to C=C2 or C=C3 (C1>C2>C3), the admittances of the first and second reactance parts 18, 20 are changed, resulting in an increase in the absolute delay time of the variable delay line 10A as shown in FIG. 4. If the first and second varactor diodes 42, 44 whose coupling capacitances C are variable in a wider range are adapted in the variable delay line 10A shown in FIG. 3, then the variable delay line 10A has a larger variable delay time.

For example, if the values of the circuit devices of the first and second reactance parts 18, 20 are adjusted such that the absolute delay time of the third output signal output to the output terminal 36 has a minimum value of about 1 ns, for example, then a deviation of the absolute delay time with respect to a frequency band higher than 100 MHz can be limited to 0.1 ns or smaller, and the variable delay time can be increased to 1 ns, as shown in FIG. 4.

Figure 5:
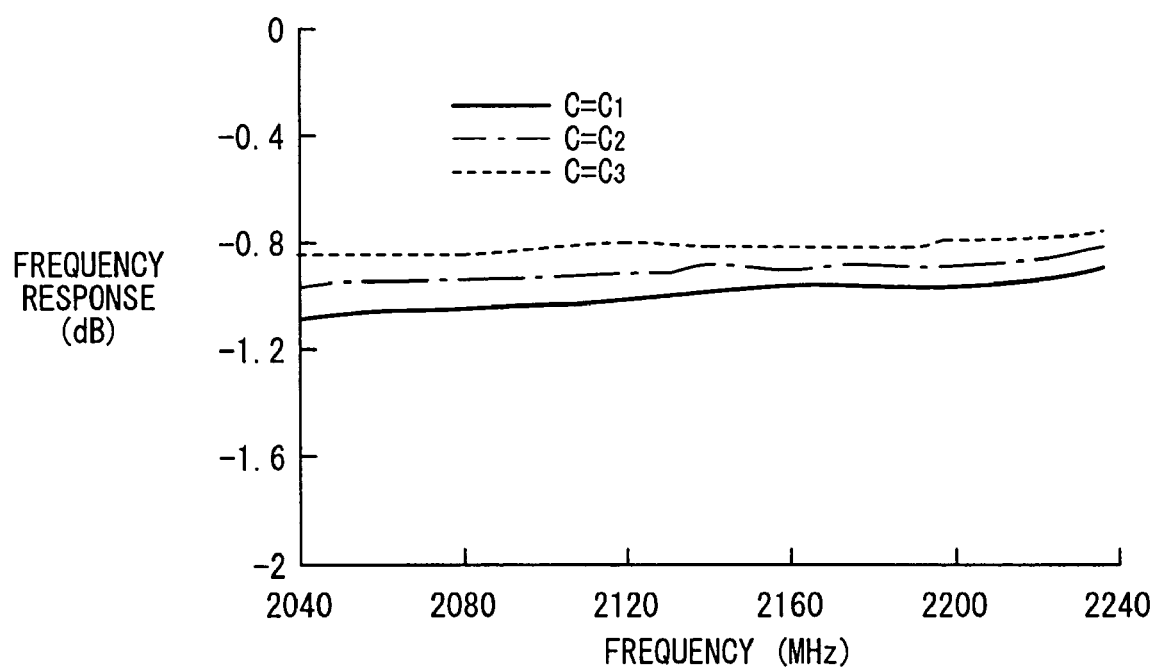
FIG. 5 is a diagram showing simulated values of the frequency response of the variable delay line shown in FIG. 3.
Figure 6:
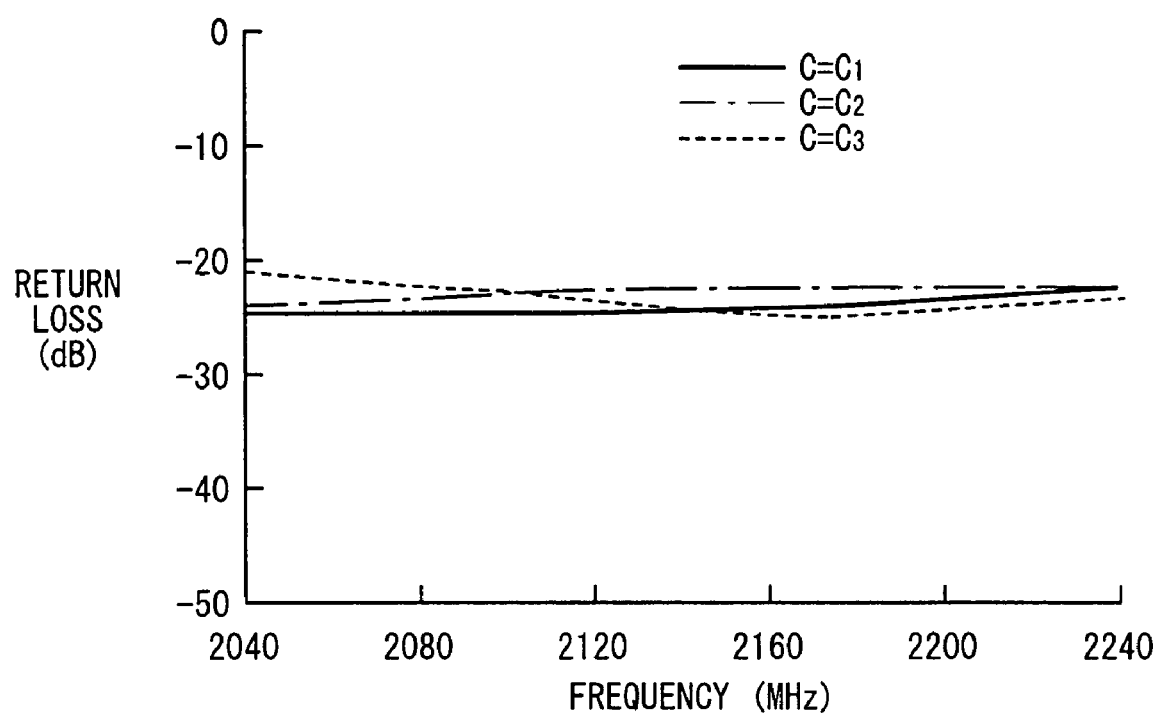
FIG. 6 is a diagram showing simulated values of the return loss of the variable delay line shown in FIG. 3.

Even when the variable delay time of the variable delay line 10A according to the first specific example is changed to about 2 ns, the frequency response shown in FIG. 5 and the return loss shown in FIG. 6 remain substantially unchanged. Therefore, the passband of the variable delay line 10A can be of a wide bandwidth of 60 MHz or greater.

If the coupling capacitances C of the variable delay line 10A according to the first specific example are changed to change the absolute delay time, then the phase of the third output signal of the variable delay line 10A changes. If the resonant frequencies of the first and second λ/4 dielectric resonators 46, 48 are changed to change the central frequency of the passband of the variable delay line 10A, then with the wide bandwidth of the variable delay line 10A, the absolute delay of the third output signal remains substantially unchanged, but only the phase of the third output signal of the variable delay line 10A changes.

Figure 7:
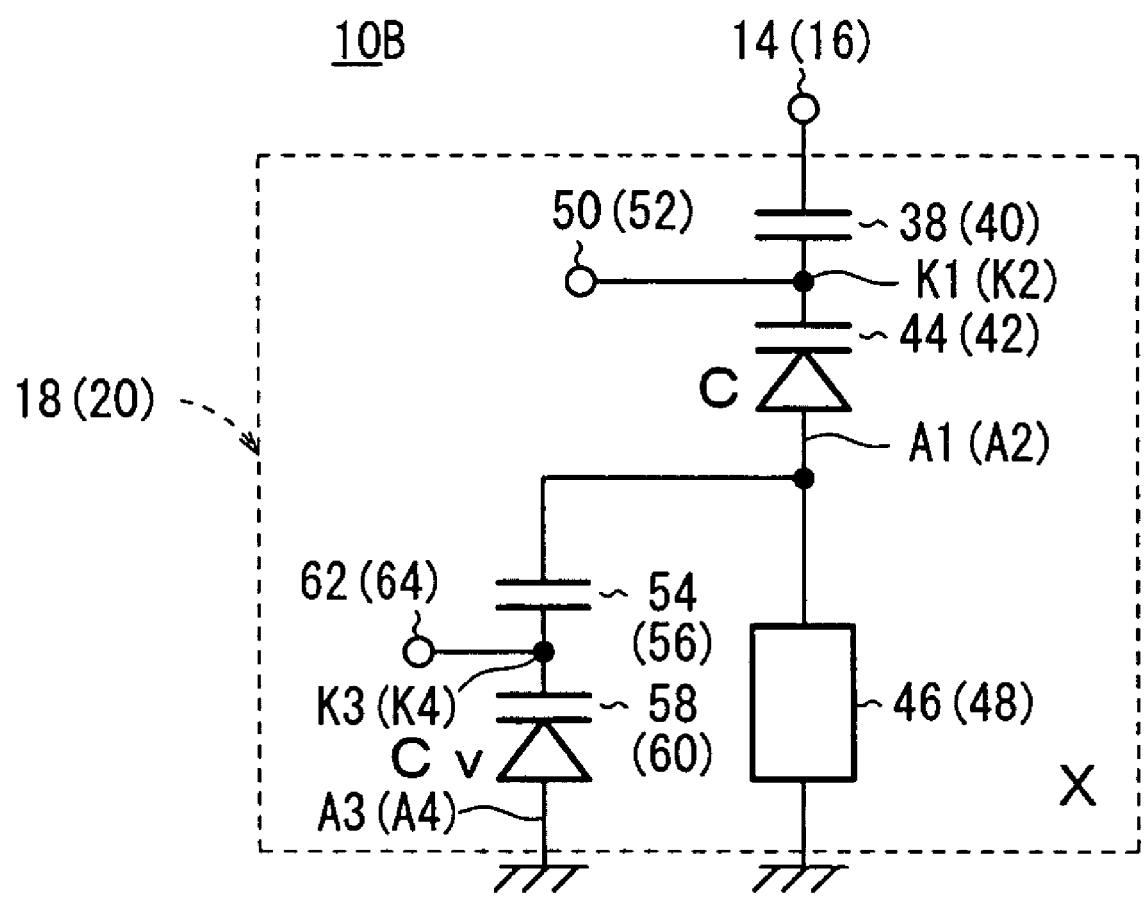
FIG. 7 is a circuit diagram of a variable delay line according to a second specific example.

The variable delay line 10B according to the second specific example shown in FIG. 7 is of substantially the same structure as the variable delay line 10A according to the first specific example shown in FIG. 3, but differs therefrom in that third and fourth capacitors 54, 56 and third and fourth varactor diodes 58, 60, which are third and fourth variable-capacitance devices serving as variable-reactance devices, are connected in parallel to the first and second λ/4 dielectric resonators 46, 48, respectively.

The third and fourth capacitors 54, 56 have respective terminals connected to the respective anode terminals A1, A2 of the first and second varactor diodes 42, 44, and other terminals connected to respective cathode terminals K1, K2 of the third and fourth varactor diodes 58, 60. The third and fourth varactor diodes 58, 60 have respective anode terminals A3, A4 which are connected to ground. Third and fourth voltage control terminals 62, 64 are connected respectively to the cathode terminals K3, K4 of the third and fourth varactor diodes 58, 60 for supplying DC voltages thereto.

With the variable delay line 10B according to the second specific example, when DC voltages having substantially the same value are supplied from the third and fourth voltage control terminals 62, 64 to the third and fourth varactor diodes 58, 60 through resistors or coils (not shown), the coupling capacitances C of the third and fourth varactor diodes 58, 60 are changed by the same value commensurate with the value of the DC voltages, thereby compensating for a change in the phase of the third output signal of the variable delay line 10B based on the change in the absolute delay time which is caused by the change in the coupling capacitances C of the first and second varactor diodes 42, 44 and the change in the central frequency which is caused by the change in the resonant frequencies of the first and second λ/4 dielectric resonators 46, 48.

Figure 8:
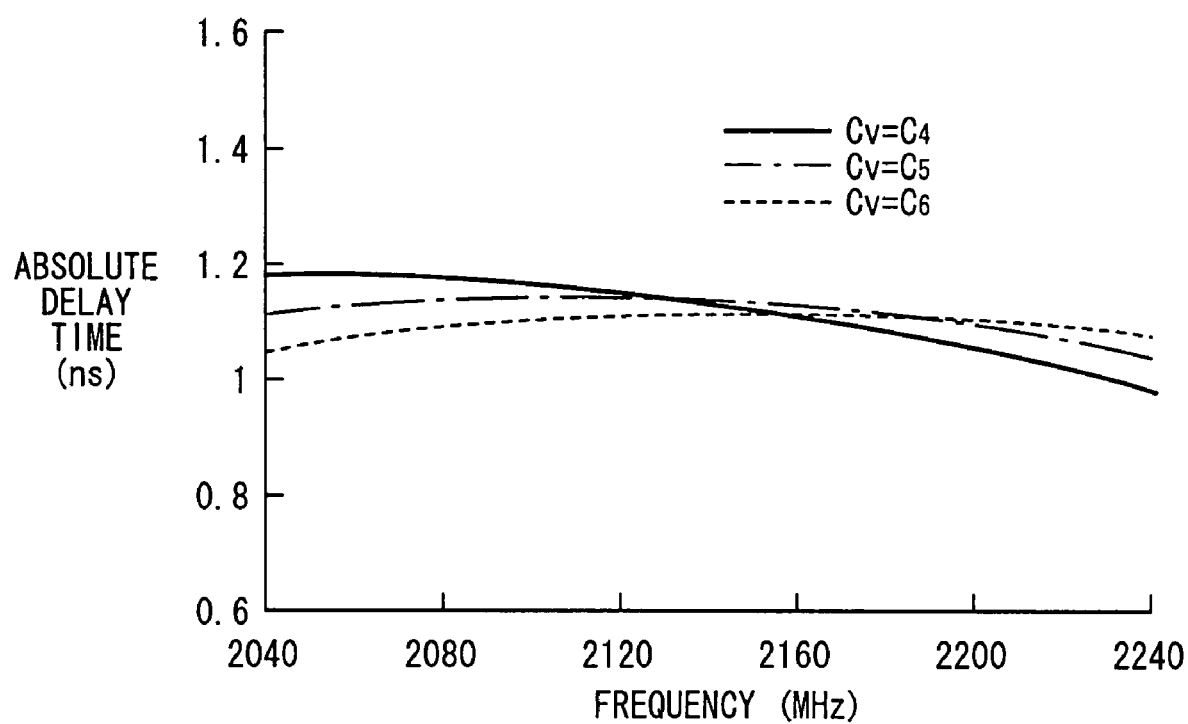
FIG. 8 is a diagram showing simulated values of the absolute delay time of the variable delay line shown in FIG. 7.
Figure 9:
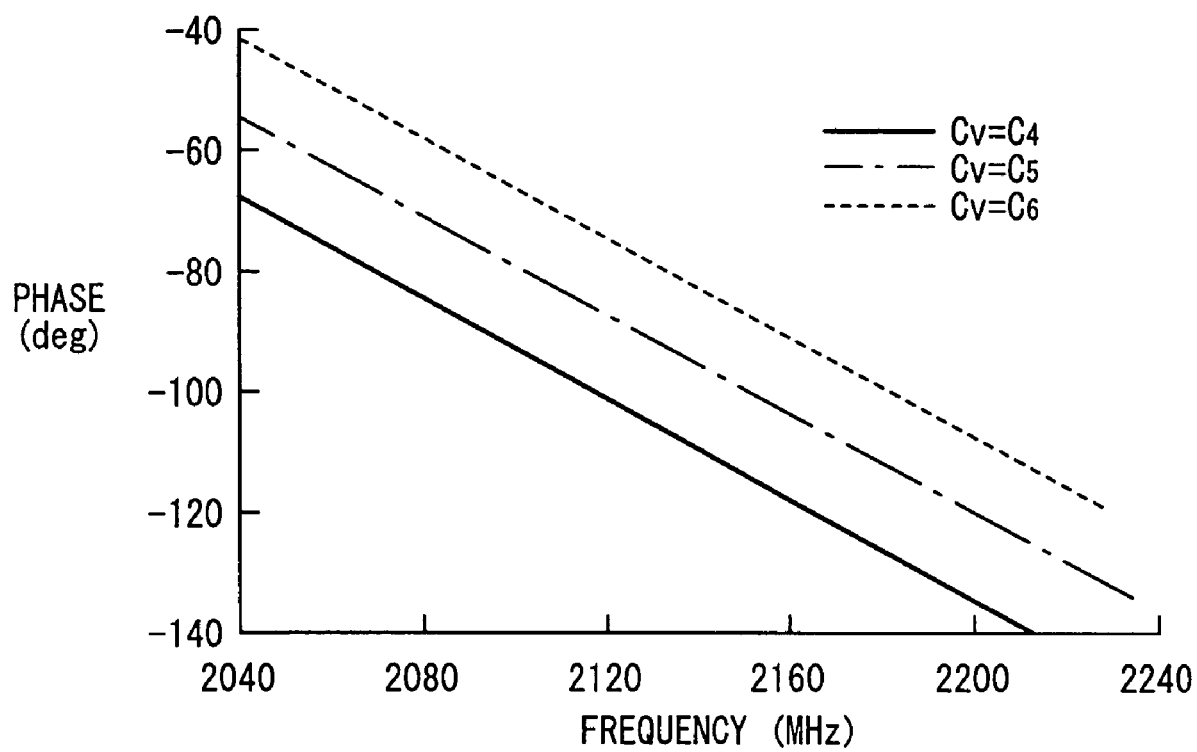
FIG. 9 is a diagram showing simulated values of the phase of the variable delay line shown in FIG. 7.

Specifically, when the coupling capacitances Cv of the third and fourth varactor diodes 58, 60 change from Cv=C4 to Cv=C5 or Cv=C6 (C4>C5>C6), it is possible to change the phase of the third output signal without affecting the absolute delay time of the variable delay line 10B, as shown in FIGS. 8 and 9. Consequently, the absolute delay time of the variable delay line 10B can be changed while keeping the phase of the third output signal at a certain value, so that the variable delay line 10B can have a desired absolute delay time and a desired variable delay time as shown in FIG. 8.

The variable delay line 10C according to the third specific example shown in FIGS. 10 through 14 is of substantially the same structure as the variable delay line 10A according to the first specific example shown in FIG. 3, but differs therefrom as follows.

Figure 10:
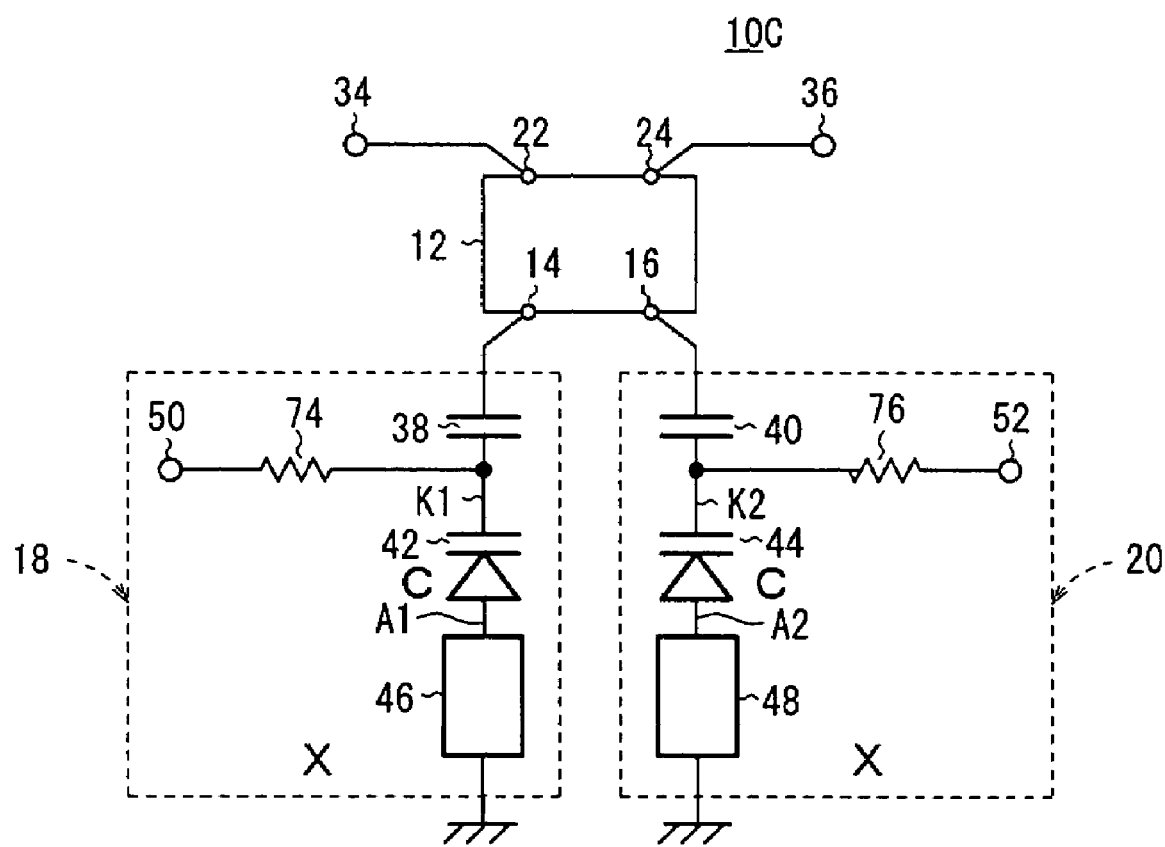
FIG. 10 is a circuit diagram of a variable delay line according to a third specific example.

As shown in FIG. 10, the first and second voltage control terminals 50, 52 are connected respectively to the cathode terminals K1, K2 of the first and second varactor diodes 42, 44 through respective resistors 74, 76. As shown in FIGS. 11 through 14, the variable delay line 10C has an integral ceramic board (integral structural body) 78 produced by stacking a plurality of ceramic layers S1, S2, S3, S4, S5, S6, S7, S8, S9, S10 and S11 as shown in FIG. 13 and sintering them into an integral body.

Figure 11:
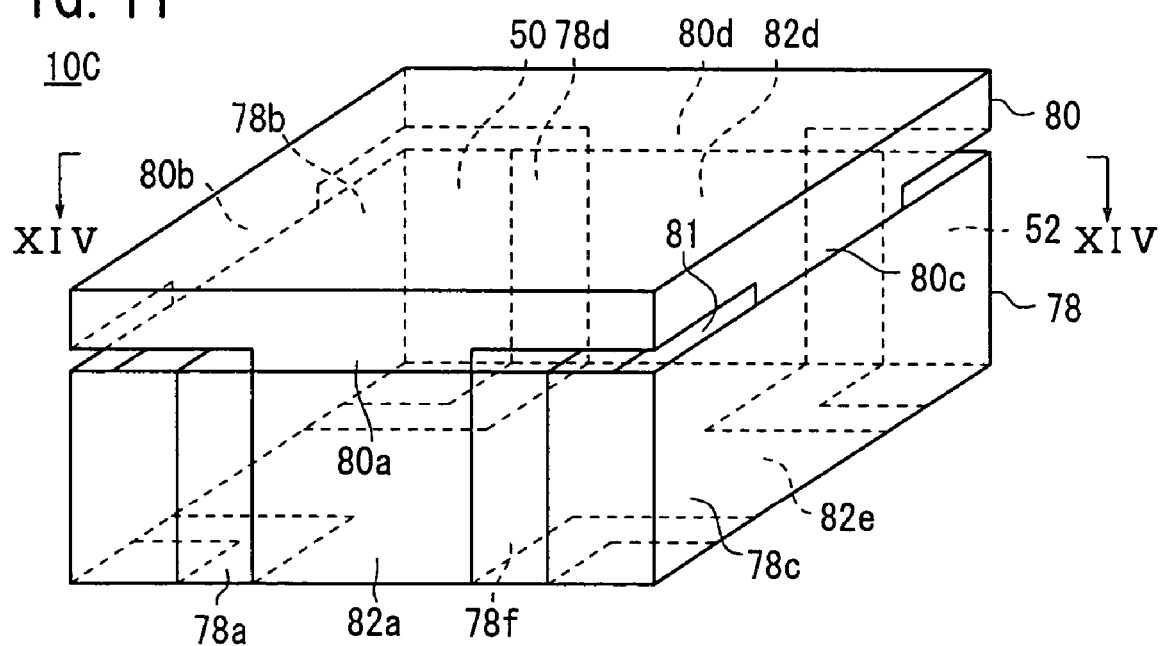
FIG. 11 is a perspective view of the variable delay line shown in FIG. 10.
Figure 12:
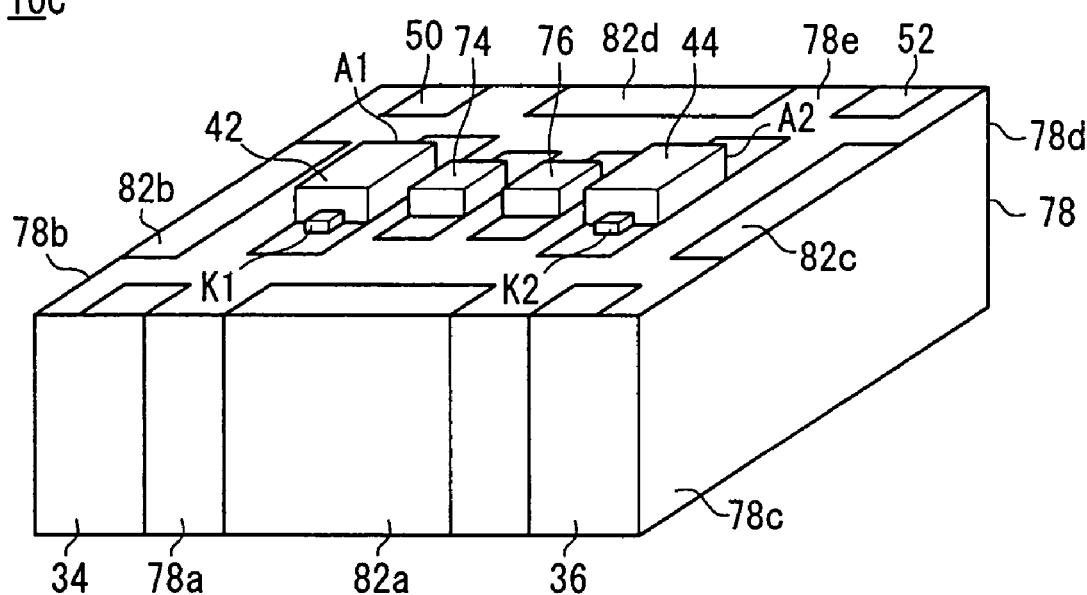
FIG. 12 is a perspective view of the variable delay line shown in FIG. 10, with a case removed.
Figure 13:
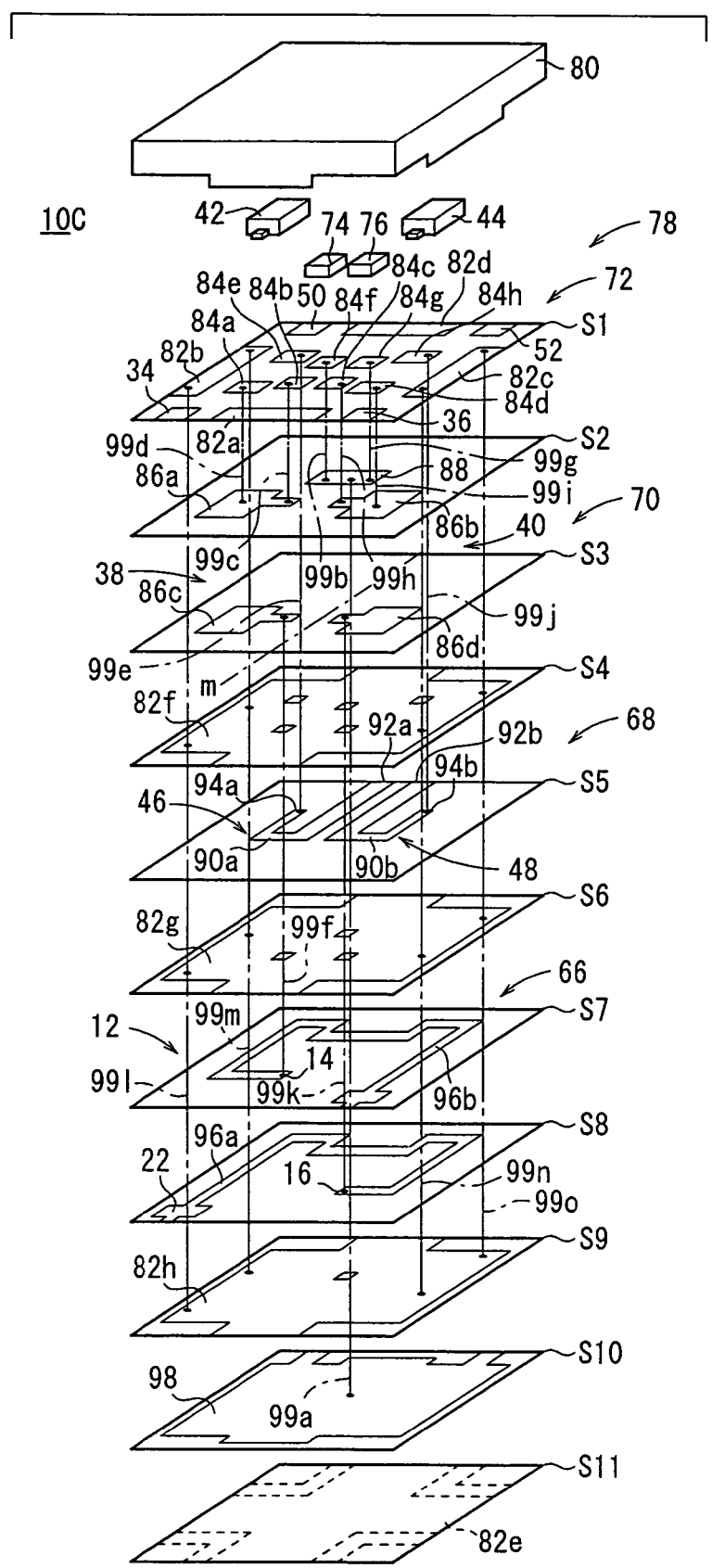
FIG. 13 is an exploded perspective view of the variable delay line shown in FIG. 10.

Specifically, as shown in FIGS. 11 and 12, the variable delay line 10C according to the third specific example has a plurality of interconnect patterns formed on the surfaces of the ceramic board 78. The first and second varactor diodes 42, 44 and the resistors 74, 76 are mounted on these interconnect patterns, and circuit devices other than the above circuit devices are formed in the ceramic board 78.

The ceramic board 78 has an upper surface 78e (see FIG. 12) covered substantially entirely with a metal case 80 (see FIG. 11) which serves as an upper lid for the ceramic board 78. The case 80 has four sides including respective legs 80a through 80d disposed centrally on lower portions thereof. When the ceramic board 78 and the case 80 are mounted on each other so that the legs 80a, 80b, 80c and 80d are held in abutment against the upper surface 78e, the upper surface 78e is covered substantially entirely by the case 80, with gaps 81 (see FIG. 11) being defined between four corners of the four sides of the case 80 which are free of the legs 80a through 80d and four corners of the upper surface 78e.

Of first through fourth side surfaces 78a, 78b, 78c and 78d as surfaces of the ceramic board 78, the first and fourth side surfaces 78a, 78d have surface ground electrodes 82a, 82d, respectively, disposed centrally therein and extending from the upper surface 78e to a lower surface 78f (see FIG. 11) of the ceramic board 78, as shown in FIGS. 11 and 12.

The first side surface 78a has the input terminal 34 disposed therein closely to the second side surface 78b and extending from the upper surface 78e to the lower surface 78f of the ceramic board 78. The first side surface 78a also has the output terminal 36 disposed therein closely to the third side surface 78c which is opposite to the second side surface 78b and extending from the upper surface 78e to the lower surface 78f of the ceramic board 78.

The fourth side surface 78d which is opposite to the first side surface 78a has the first voltage control terminal 50 disposed therein closely to the second side surface 78b and extending from the upper surface 78e to the lower surface 78f of the ceramic board 78. The fourth side surface 78d also has the second voltage control terminal 52 disposed therein closely to the third side surface 78c and extending from the upper surface 78e to the lower surface 78f of the ceramic board 78.

The input terminal 34, the output terminal 36, the first and second voltage control terminals 50, 52, and the surface ground electrodes 82a, 82d extend from the first through fourth side surfaces 78a through 78d to the upper surface 78e and the lower surface 78f, as shown in FIGS. 12 and 13.

The upper surface 78e has a surface ground electrode 82b disposed centrally therein closely to the second side surface 78b out of direct contact with the input terminal 34, the output terminal 36, and the first and second voltage control terminals 50, 52. The upper surface 78e also has a surface ground electrode 82c disposed centrally therein closely to the third side surface 78c out of direct contact with the input terminal 34, the output terminal 36, and the first and second voltage control terminals 50, 52.

Figure 14:
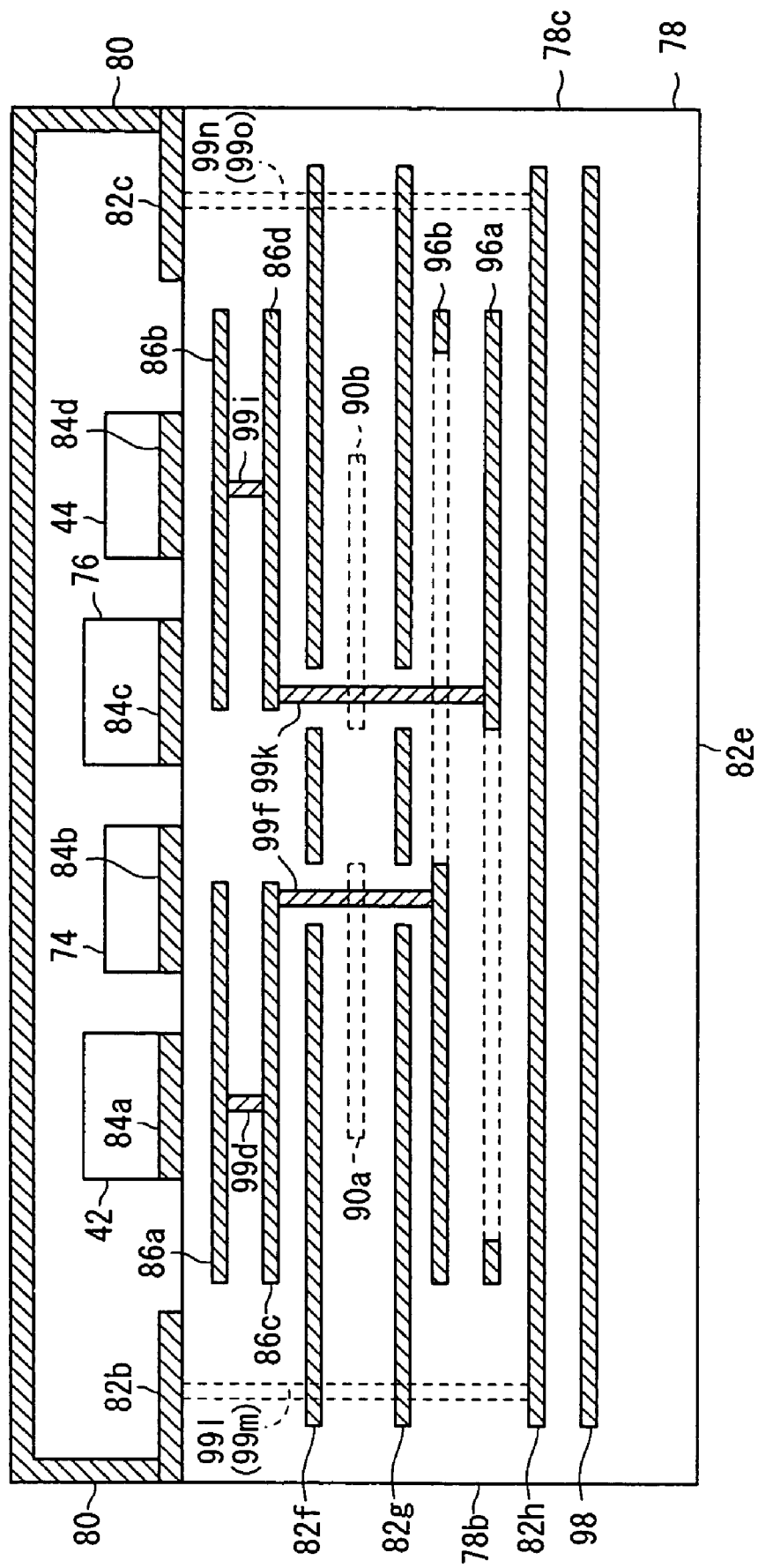
FIG. 14 is a cross-sectional view of the variable delay line shown in FIG. 10.
Figure 15:
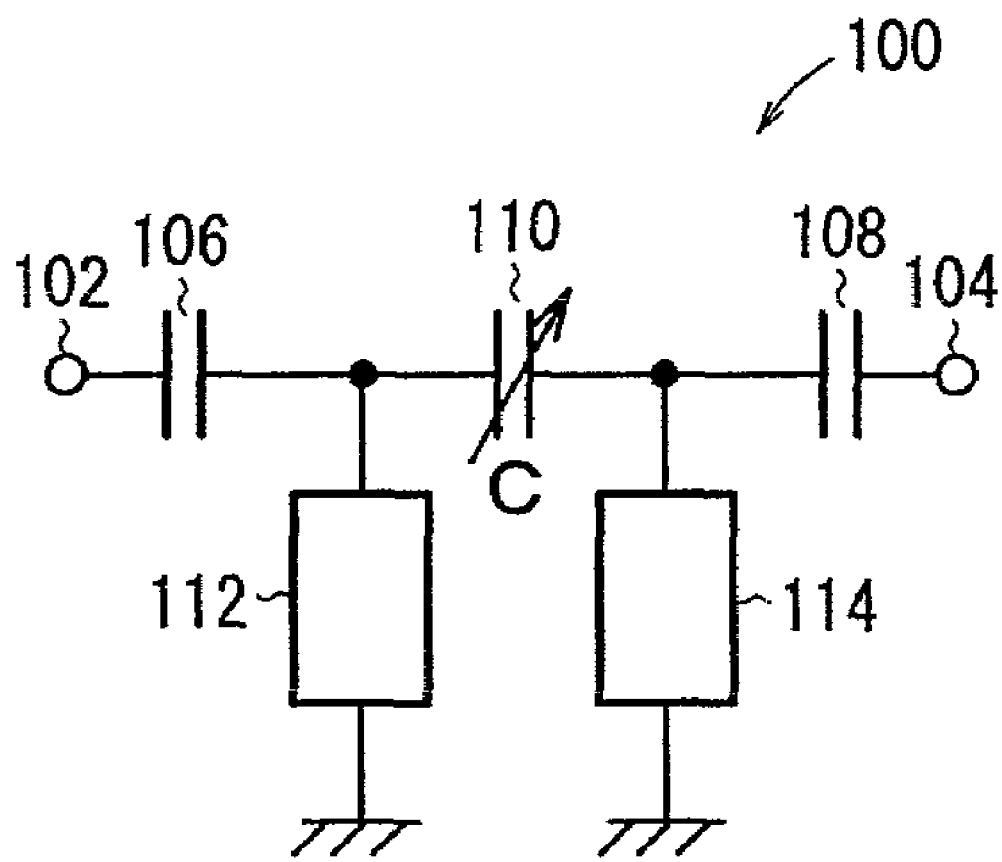
FIG. 15 is a circuit diagram of a conventional variable delay line.
Figure 16:
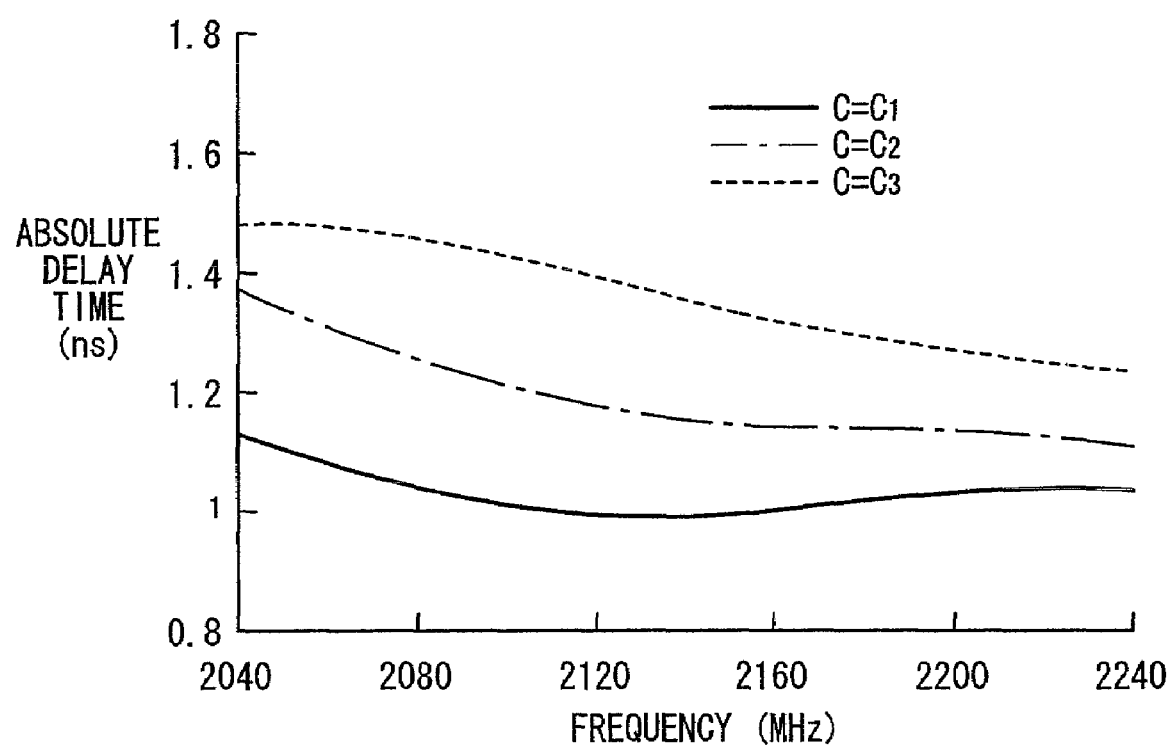
FIG. 16 is a diagram showing simulated values of the absolute delay time of the variable delay line shown in FIG. 15.
Figure 17:
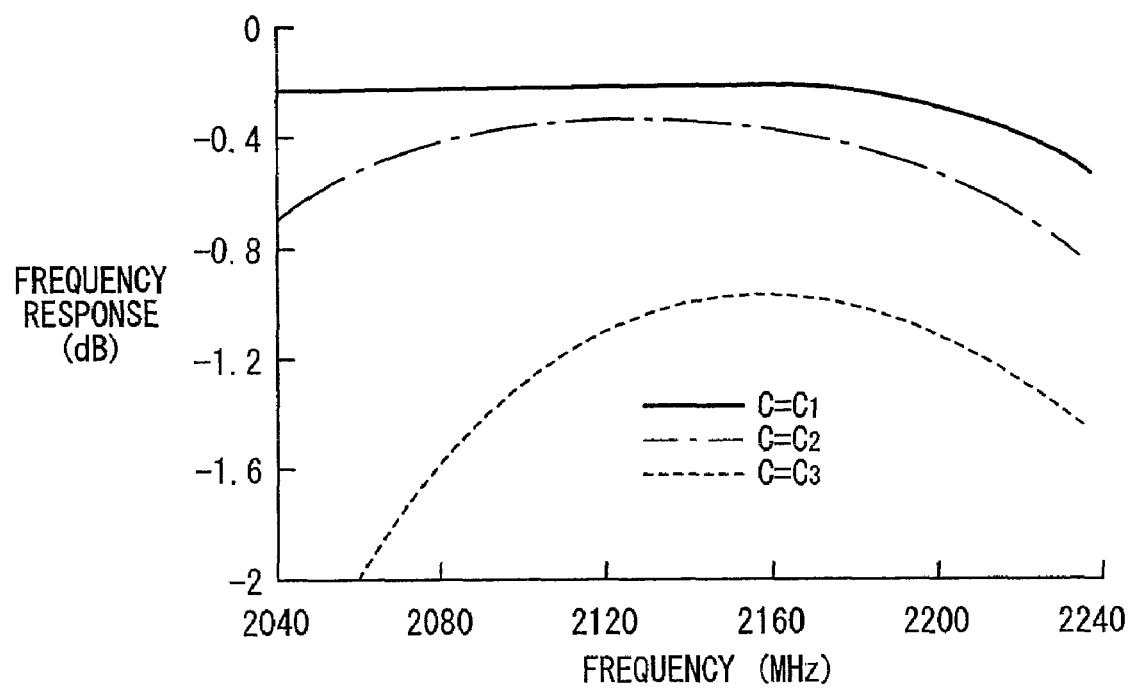
FIG. 17 is a diagram showing simulated values of the frequency response of the variable delay line shown in FIG. 15.

When the case 80 and the upper surface 78e of the ceramic board 78 are mounted on each other, as shown in FIGS. 11 and 14, the surface ground electrodes 82a through 82d are held in direct contact with the legs 80a through 80d of the case 80, shielding all of the circuit devices of the variable delay line 10C from the outside. The gaps 81 that are defined when the case 80 and the ceramic board 78 are mounted on each other serve as clearances between the case 80 and the input terminal 34, the output terminal 36, the first and second voltage control terminals 50, 52.

As shown in FIGS. 11 and 13, the lower surface 78f has a surface ground electrode 82e disposed substantially entirely thereon. The input terminal 34, the output terminal 36, and the first and second voltage control terminals 50, 52 are held out of direct contact with the surface ground electrodes 82a through 82e, but spaced a predetermined distance therefrom.

As shown in FIGS. 12 and 13, the upper surface 78e has terminals 84a through 84h disposed centrally thereon, and held out of direct contact with the input terminal 34, the output terminal 36, the first and second voltage control terminals 50, 52, and the surface ground electrodes 82a through 82d, but formed in parallel therewith at a predetermined distance. The first and second varactor diodes 42, 44 and the resistors 74, 76 are mounted on the upper surface 78e with the terminals 84a through 84h disposed thereon.

The cathode terminals K1, K2 (see FIG. 10) of the first and second varactor diodes 42, 44 are connected to the terminals 84a, 84d, and the anode terminals A1, A2 (see FIG. 11) thereof are connected to the terminals 84e, 84h. The resistors 74, 76 are connected to the terminals 84b, 84c, 84f, 84g. The resistors 74, 76 comprise chip resistors, for example.

The variable delay line 10C according to the third specific example has the ceramic board 78 which is constructed by stacking the ceramic layers (S1 through S11) as stated above and sintering them into an integral body, as shown in FIGS. 13 and 14.

The ceramic board 78 is constructed of a stack of the first through eleventh ceramic layers S1 through S11. Each of the first through eleventh ceramic layers S1 through S11 comprises a single layer or a plurality of layers.

In the ceramic board 78, the second ceramic layer S2 has a capacitor electrode 86a disposed on a principal surface thereof opposite to the terminals 84a, 84b. The capacitor electrode 86a is of a substantially inverted T-shape including a larger area opposite to the terminal 84a and a smaller area opposite to the terminal 84b.

The second ceramic layer S2 also has a capacitor electrode 86b disposed on the principal surface thereof opposite to the terminals 84c, 84d in axial symmetry with respect to the capacitor electrode 86a across a bisector m (a perpendicular line interconnecting the first and fourth side surfaces 78a, 78d: typically indicated on a principal surface of the third ceramic layer S3) that bisects a straight line interconnecting the second and third side surfaces 78b, 78c. The capacitor electrodes 86a, 86b have respective small areas that facing each other across the bisector m.

The second ceramic layer S2 further has a connection electrode 88 disposed on the principal surface thereof opposite to the terminals 84f, 84g out of direct contact with the capacitor electrodes 86a, 86b.

The third ceramic layer S3 has, on a principal surface thereof, a capacitor electrode 86c having a shape which is substantially the same as the shape of the capacitor electrode 86a and disposed opposite to the capacitor electrode 86a, and a capacitor electrode 86d having a shape which is substantially the same as the shape of the capacitor electrode 86b and disposed opposite to the capacitor electrode 86b. The capacitor electrodes 86a, 86c disposed opposite to each other across the second ceramic layer S2 make up the first capacitor 38, and the capacitor electrodes 86b, 86d disposed opposite to each other across the second ceramic layer S2 make up the second capacitor 40.

The fifth ceramic layer S5 has first and second resonant electrodes 90a, 90b disposed centrally on a principal surface thereof and serving as the first and second λ/4 dielectric resonators 46, 48. The first and second resonant electrodes 90a, 90b extend from the fourth side surface 78d toward the first side surface 78a. The first and second resonant electrodes 90a, 90b are positioned in axial symmetry with each other across the bisector m.

The first resonant electrode 90a has one end as a short-circuited end 92a connected to the fourth side surface 78d and an opposite end as an open end 94a disposed out of direct contact with the surface ground electrodes 82a, 82d. The first resonant electrode 90a is provided as a substantially J-shaped interconnect pattern on the principal surface of the fifth ceramic layer S5. Specifically, the substantially J-shaped interconnect pattern extends from the fourth side surface 78d to which the short-circuited end 92a is connected toward the first side surface 78a, and is bent toward the second side surface 78b in a central area of the fifth ceramic layer S5, and is also bent again toward the fourth side surface 78d. The tip end of the portion bent toward the fourth side surface 78d serves as the open end 94a that faces the fourth side surface 78d.

The second resonant electrode 90b is provided as a substantially J-shaped interconnect pattern disposed in axial symmetry with respect to the first resonant electrode 90a across the bisector m as described above. Specifically, the second resonant electrode 90b has one end as a short-circuited end 92b connected to the fourth side surface 78d and an opposite end as an open end 94b disposed out of direct contact with the surface ground electrodes 82a, 82d and facing the fourth side surface 78d.

The eighth ceramic layer S8 has, on a principal surface thereof, a substantially J-shaped first interconnect pattern 96a having a beginning end on the first side surface 78a near the second side surface 78b and a terminal end confronting the capacitor electrode 86d across the third through seventh ceramic layers S3 through S7. The beginning end is connected to the input terminal 34, and the terminal end is disposed out of direct contact with the surface ground electrodes 82a, 82d.

The seventh ceramic layer S7 has, on a principal surface thereof, a substantially J-shaped second interconnect pattern 96b having a beginning end on the first side surface 78a near the third side surface 78c and a terminal end confronting the capacitor electrode 86c across the third through seventh ceramic layers S3 through S7. The beginning end is connected to the output terminal 36, and the terminal end is disposed out of direct contact with the surface ground electrodes 82a, 82d.

The first and second interconnect patterns 96a, 96b make up the hybrid coupler 12. The beginning end of the first interconnect pattern 96a is the input terminal 22 of the hybrid coupler 12, and the terminal end thereof corresponds to the second output terminal 16. The beginning end of the second interconnect pattern 96b is the isolation terminal 24 of the hybrid coupler 12, and the terminal end thereof corresponds to the first output terminal 14.

A DC voltage supply electrode (DC electrode) 98 is disposed substantially entirely on a principal surface of the tenth ceramic layer S10 out of direct contact with the surface ground electrodes 82a, 82d. The DC electrode 98 is connected to the first and second voltage control terminals 50, 52 disposed on the fourth side surface 78d.

Inner-layer ground electrodes 82f through 82h are disposed substantially entirely on respective principal surfaces of the fourth, sixth, and ninth ceramic layers S4, S6, S9.

The inner-layer ground electrode 82f electrically separates the second and third ceramic layers S2, S3 (capacitor layer 70) of the first and second capacitors 38, 40 and the fourth and fifth ceramic layers S4, S5 (resonant circuit layer 68) of the first and second λ/4 dielectric resonators 46, 48 from each other. The inner-layer ground electrode 82f has electrically insulated electrode-free regions (insulated regions) that face the terminals 84e, 84h, the capacitor electrodes 86c, 86d, and the connection electrode 88.

The inner-layer ground electrode 82g electrically separates the fourth and fifth ceramic layers S4, S5 (resonant circuit layer 68) of the first and second λ/4 dielectric resonators 46, 48 and the sixth through eighth ceramic layers S6 through S8 (hybrid coupler layer 66) of the hybrid coupler 12 from each other. The inner-layer ground electrode 82g has insulated regions that face the connection electrode 88, the terminal end of the first interconnect pattern 96a, and the terminal end of the second interconnect pattern 96b.

The inner-layer ground electrode 82h electrically separates the sixth through eighth ceramic layers S6 through S8 (hybrid coupler layer 66) of the hybrid coupler 12 and the DC electrode 98 from each other. The inner-layer ground electrode 82h has an insulated region that faces the connection electrode 88.

Further, the first ceramic layer S1 functions as a varactor diode layer 72, and the first and second varactor diodes 42, 44 are mounted on the upper surface 78e thereof.

The connection electrode 88 and the DC electrode 98 are connected to each other by a via hole 99a that is defined through the insulated regions of the inner-layer ground electrodes 82f through 82h. The connection electrode 88 and the terminal 84f are connected to each other by a via hole 99b. The terminal 84f and the capacitor electrode 86a are connected to each other by a via hole 99c. The terminal 84a and the capacitor electrode 86a are connected to each other by a via hole 99d.

With the above arrangement, when a DC voltage is supplied through the first voltage control terminal 50 to the DC electrode 98, the DC voltage is supplied to the cathode electrode K1 of the first varactor diode 42.

The terminal 84e and the open end 94a of the first resonant electrode 90a are connected to each other by a via hole 99e that is defined through the insulated region of the inner-layer ground electrode 82f. The capacitor electrode 86c and the terminal end of the second interconnect pattern 96b are connected to each other by a via hole 99f that is defined through the insulated regions of the inner-layer ground electrodes 82f, 82g. Thus, there is provided a series-connected circuit having the first capacitor 38, the first varactor diode 42, and the first λ/4 dielectric resonator 46.

The connection electrode 88 and the terminal 84g are connected to each other by a via hole 99g. The terminal 84c and the capacitor electrode 86b are connected to each other by a via hole 99h. The capacitor electrode 86b and the terminal 84d are connected to each other by a via hole 99i.

With the above arrangement, when a DC voltage is supplied through the second voltage control terminal 52 to the DC electrode 98, the DC voltage is supplied to the cathode electrode K2 of the second varactor diode 44.

The terminal 84h and the open end 94b of the second resonant electrode 90b are connected to each other by a via hole 99j that is defined through the insulated region of the inner-layer ground electrode 82f. The capacitor electrode 86d and the terminal end of the first interconnect pattern 96a are connected to each other by a via hole 99k that is defined through the insulated regions of the inner-layer ground electrodes 82f, 82g. Thus, there is provided a series-connected circuit having the second capacitor 40, the second varactor diode 44, and the second λ/4 dielectric resonator 48.

The surface ground electrode 82b and the inner-layer ground electrodes 82f through 82h are connected to each other by two via holes 99l, 99m that are defined through the first through eighth ceramic layers S1 through S8. The via hole 99l is defined so as to extend from a portion of the surface ground electrode 82b close to the first side surface 78a toward the lower surface 78f. The via hole 99m is defined so as to extend from a portion of the surface ground electrode 82b close to the fourth side surface 78d toward the lower surface 78f.

The surface ground electrode 82c and the inner-layer ground electrodes 82f through 82h are connected to each other by two via holes 99n, 99o that are defined through the first through eighth ceramic layers S1 through S8. The via hole 99n is defined so as to extend from a portion of the surface ground electrode 82c close to the first side surface 78a toward the lower surface 78f. The via hole 99o is defined so as to extend from a portion of the surface ground electrode 82c close to the fourth side surface 78d toward the lower surface 78f.

The variable delay line 10C according to the third specific example can be reduced in size because the circuit devices except the first and second varactor diodes 42, 44 and the resistors 74, 76 are disposed in the ceramic board 78.

With the variable delay lines 10A, 10B according to the first and second specific examples (see FIGS. 3 and 7), as with the variable delay line 10C according to the third specific example, the hybrid coupler 12, the first and second λ/4 dielectric resonators 46, 48, and the first through fourth capacitors 38, 40, 54, 56 may be disposed in the ceramic board 78, and the first through fourth varactor diodes 42, 44, 58, 60 may be mounted on the ceramic board 78 from the outside.

The variable delay line according to the present invention is not limited to the above embodiment, but may employ various structures without departing from the scope of the invention.

INDUSTRIAL APPLICABILITY

As described above, a variable delay line according to the present invention has a hybrid coupler and variable-reactance devices which are connected respectively to two output terminals of the hybrid coupler for thereby suppressing variations in an input impedance and an output impedance of the variable delay line, setting the absolute delay time and the variable delay time of the variable delay line to desired values, and widening the passband of the variable delay line.

The invention claimed is:

1. A variable delay line comprising:
a hybrid coupler having an input terminal for receiving an input signal, first and second output terminals for outputting first and second output signals, respectively, which are 90° out of phase with each other, and an isolation terminal for outputting a reflected signal based on said first and second output signals as a third output signal; and
first and second reactance parts connected respectively to said first and second output terminals, said first and second reactance parts having substantially the same reactance,
said first and second reactance parts comprising first and second variable-reactance devices and first and second resonant circuits, respectively, said first and second variable-reactance devices comprising respective first and second series-connected circuits of first and second capacitors having substantially the same capacitance, and first and second variable-capacitance devices, each of said resonant circuits being connected between said respective variable-reactance device and a common ground, and said variable-reactance devices having substantially the same reactance.

2. A variable delay line according to claim 1 further comprising third and fourth series-connected circuits having third and fourth capacitors and third and fourth variable-capacitance devices as variable-reactance devices, respectively, said third and fourth series connected circuits being connected in parallel to said first resonant circuit and said second resonant circuit, respectively, such that an input of each of said third and fourth series connected circuit is connected to an input of said respective resonant circuit and outputs of each of said third and fourth series connected circuits and said respective resonant circuits are connected to the common ground.

3. A variable delay line according to claim 1 further comprising an integral structural body, said integral structural body having a ceramic layer with said hybrid coupler disposed thereon, a ceramic layer with said first resonant circuit and said second resonant circuit disposed thereon, and a ceramic layer with at least said first and second capacitors disposed thereon.

4. A variable delay line according to claim 2 further comprising an integral structural body, said integral structural body having a ceramic layer with said hybrid coupler disposed thereon, a ceramic layer with said first resonant circuit and said second resonant circuit disposed thereon, and a ceramic layer with at least said first and second capacitors disposed thereon.

* * * * *